United States Patent
Schmidt

(10) Patent No.: US 7,567,851 B2
(45) Date of Patent: Jul. 28, 2009

(54) METHOD AND SYSTEM FOR DYNAMICALLY CHANGING THE TRANSPORT SEQUENCING IN A CLUSTER TOOL

(75) Inventor: Kilian Schmidt, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 11/621,707

(22) Filed: Jan. 10, 2007

(65) Prior Publication Data

US 2007/0282474 A1    Dec. 6, 2007

(30) Foreign Application Priority Data

May 31, 2006    (DE) .................... 10 2006 025 407

(51) Int. Cl.
*G06F 19/00* (2006.01)
(52) U.S. Cl. .................. 700/103; 700/112; 700/121
(58) Field of Classification Search ............. 700/121, 700/99, 103, 112
See application file for complete search history.

(56) References Cited

U.S. PATENT DOCUMENTS

2004/0087187 A1* 5/2004 Oh .......................... 438/800
2004/0243266 A1* 12/2004 Mata et al. .................. 700/99
2005/0256599 A1* 11/2005 Peng .......................... 700/100
2007/0061034 A1* 3/2007 Puri et al. .................... 700/112

FOREIGN PATENT DOCUMENTS

DE    102 40 115 A1    3/2004
EP    1 025 470 B1    10/1998

* cited by examiner

*Primary Examiner*—Kidest Bahta
*Assistant Examiner*—Nathan Laughlin
(74) *Attorney, Agent, or Firm*—Williams, Morgan & Amerson

(57) ABSTRACT

By dynamically adapting the transport sequencing rules of a cluster tool, the overall performance of the tool may be increased. In some illustrative embodiments, the transport sequencing rule for a robot handler may be dynamically changed when a lot of small size is present in one of the load ports in order to increase the window of opportunity for carrier exchange of a standard lot size currently processed. Consequently, by reducing the overall process time for the currently processed lot while delaying the completion of the small lot, the currently processed carrier may be exchanged earlier, thereby reducing the overall cycle time of the currently processed lot and/or providing a next lot earlier to the tool.

20 Claims, 6 Drawing Sheets

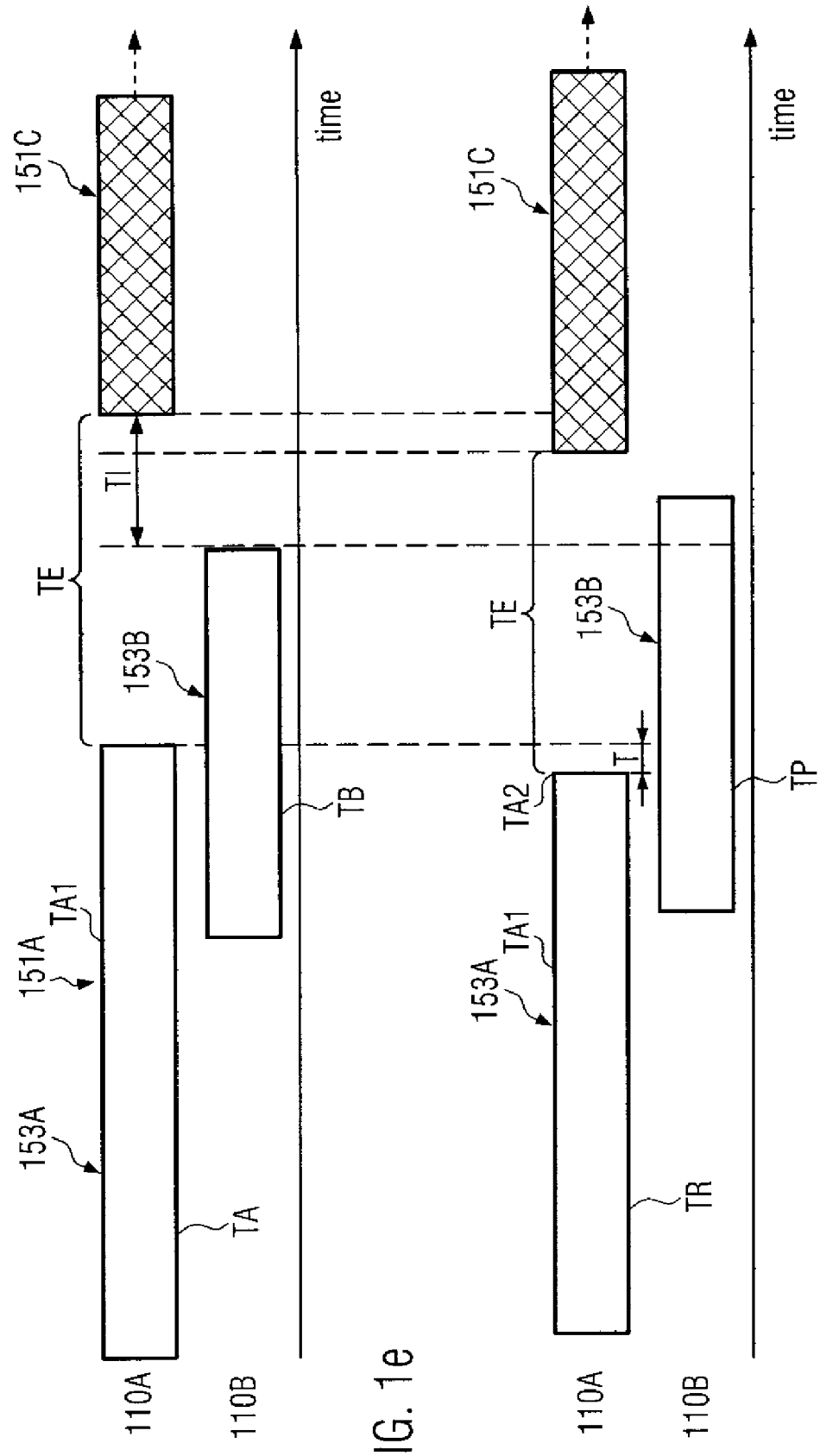

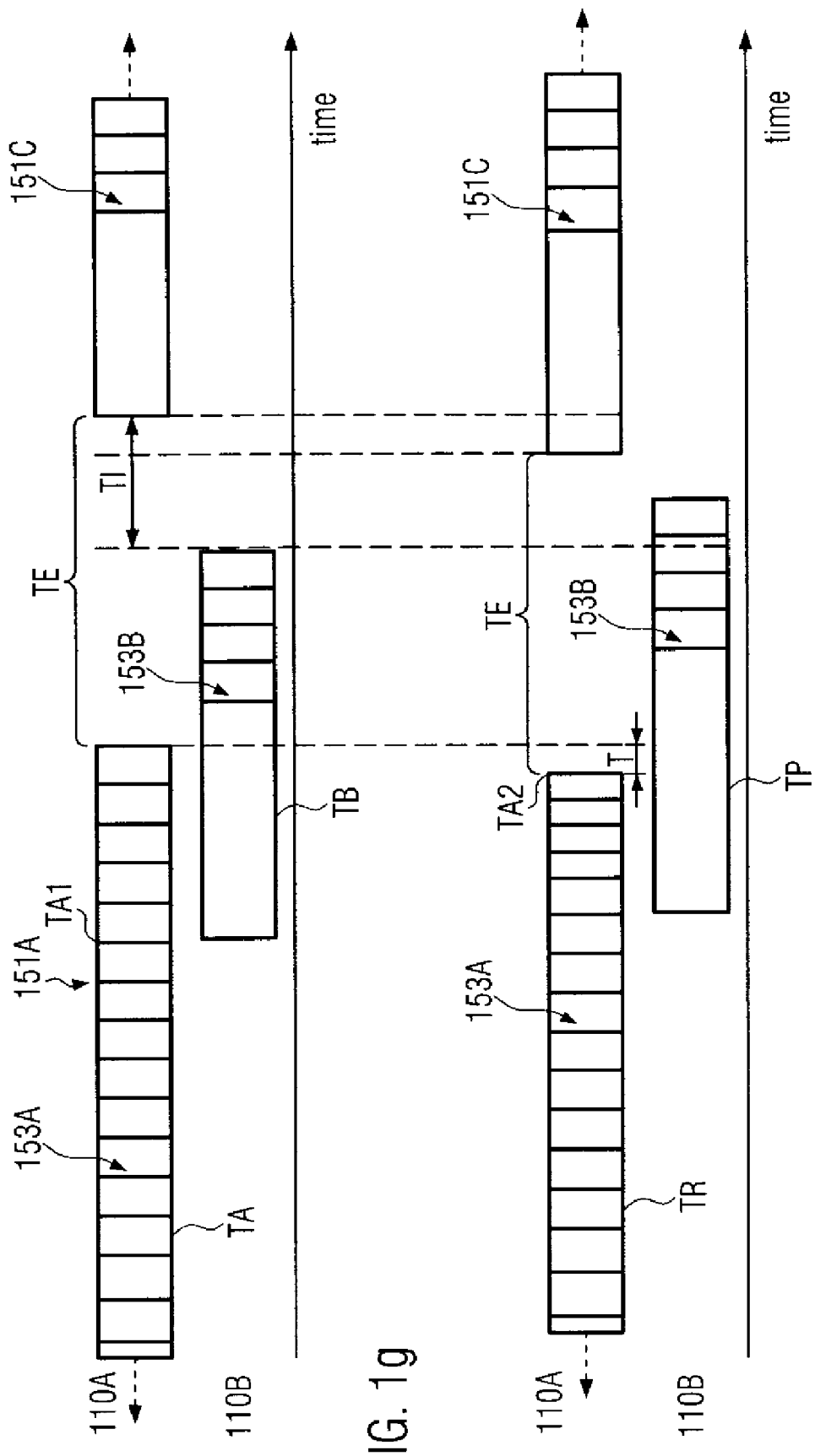

METHOD AND SYSTEM FOR DYNAMICALLY CHANGING THE TRANSPORT SEQUENCING IN A CLUSTER TOOL

BACKGROUND OF THE DISCLOSURE

1. Field of the Disclosure

Generally, the present disclosure relates to the field of fabricating microstructures, such as integrated circuits, and, more particularly, to the transport characteristics of complex process tools, such as cluster tools, used for the fabrication of semiconductor devices or other microstructures.

2. Description of the Related Art

Today's global market forces manufacturers of mass products to offer high quality products at a low price. It is thus important to improve yield and process efficiency to minimize production costs. This holds especially true in the field of microstructure fabrication, for instance for manufacturing semiconductor devices, since, in this field, it is essential to combine cutting-edge technology with mass production techniques. It is, therefore, the goal of manufacturers of semiconductors, or generally of microstructures, to reduce the consumption of raw materials and consumables while at the same time improve process tool utilization. The latter aspect is especially important since, in modern semiconductor facilities, equipment is required which is extremely cost-intensive and represents the dominant part of the total production costs. At the same time, the process tools of the semiconductor facility have to be replaced more frequently compared to most other technical fields due to the rapid development of new products and processes, which may also demand correspondingly adapted process tools.

Integrated circuits are typically manufactured in automated or semi-automated facilities, thereby passing through a large number of process and metrology steps to complete the device. The number and the type of process steps and metrology steps a semiconductor device has to go through depends on the specifics of the semiconductor device to be fabricated. A usual process flow for an integrated circuit may include a plurality of photolithography steps to image a circuit pattern for a specific device layer into a resist layer, which is subsequently patterned to form a resist mask for further processes in structuring the device layer under consideration by, for example, etch or implant processes and the like. Thus, layer after layer, a plurality of process steps are performed based on a specific lithographic mask set for the various layers of the specified device. For instance, a sophisticated CPU requires several hundred process steps, each of which has to be carried out within specified process margins so as to fulfill the specifications for the device under consideration. As the majority of the process margins are device-specific, many of the metrology processes and the actual manufacturing processes are specifically designed for the device under consideration and require specific parameter settings at the adequate metrology and process tools.

In a semiconductor facility, a plurality of different product types are usually manufactured at the same time, such as memory chips of different design and storage capacity, CPUs of different design and operating speed and the like, wherein the number of different product types may even reach hundreds and more in production lines for manufacturing ASICs (application specific ICs). Since each of the different product types may require a specific process flow, possibly based on different mask sets for the lithography, specific settings in the various process tools, such as deposition tools, etch tools, implantation tools, chemical mechanical polishing (CMP) tools and the like, may be necessary. Consequently, a plurality of different tool parameter settings and product types may be encountered simultaneously in a manufacturing environment.

Hereinafter, the parameter setting for a specific process in a specified process tool or metrology or inspection tool may be commonly referred to as process recipe or simply as recipe. Thus, a large number of different process recipes, even for the same type of process tools, may be required which have to be applied to the process tools at the time the corresponding product types are to be processed in the respective tools. However, the sequence of process recipes performed in process and metrology tools, or in functionally combined equipment groups, as well as the recipes themselves, may have to be frequently altered due to fast product changes and highly variable processes involved. As a consequence, tool performance, especially in terms of throughput, is a very critical manufacturing parameter as it significantly affects the overall production costs of the individual devices. The progression of throughput over time of individual process and metrology tools, or even certain entities thereof, such as process modules, substrate robot handlers, load ports and the like, may, however, remain unobserved due to the complexity of the manufacturing sequences including a large number of product types and a corresponding large number of processes, which in turn are subjected to frequent recipe changes.

Recently, process tools have become more complex in that a process tool may include a plurality of functional modules or entities, referred to as cluster or cluster tool, which may operate in a parallel and/or sequential manner such that products arriving at the cluster tool may be operated therein in a plurality of process paths, depending on the process recipe and the current tool state. The cluster tool may enable the performance of a sequence of correlated processes, thereby enhancing overall efficiency by, for instance, reducing transport activities within the factory, and/or to increase tool capacity and availability by using several process chambers in parallel for the same process step. In a cluster tool, several modules or entities are typically served by one robot substrate handler, wherein the different process times, due to different recipes and the like, and/or the parallel processing in some of the modules, may result in competitive transport tasks, thereby generating a dynamic, i.e., a time-varying sequence of events. When several transport tasks are pending at a time, then the robot may operate on the basis of a predefined static rule in order to select an appropriate task for attempting to achieve a desired tool performance, such as maximum tool utilization and the like. This rule may prescribe, for example, to choose the substrate having experienced the least number of process steps from all the substrates requesting transport by the robot handler at this time, or to select the transport task having the destination with the highest predefined priority and the like. In many cases the transport sequencing rule is preselected, in view of tool utilization, such that the "bottleneck" module, i.e., the process module of the cluster tool having the least process capacity, is served so as to enable a substantially continuous operation, thereby typically producing a high tool utilization as long as substrates are available at the cluster tool.

In typical semiconductor facilities, the substrates are transported in groups, referred to as lots, within specific carriers designed to accommodate a specified number of substrates. As previously explained, many different types of products in different manufacturing stages may be present within the facility, such as test substrates, pilot substrates, special order devices and the like. Hence, the lots may have different sizes, i.e., the respective carriers are not completely filled, which may contribute significantly to a highly dynamic situation at the various process tools, since typically the minimum time for carrier exchange is independent from the number of substrates, whereas exchange time necessary for continuously keeping the process tool fed with substrates may vary significantly with lot size as a more frequent carrier exchange at a load port in combination with reduced process times required by a reduced number of substrates per lot may also reduce the time usable for exchanging a carrier substantially without negatively affecting the overall operation of the process tool. The time available for carrier exchange may be referred to as window of opportunity for carrier exchange and may represent a significant factor determining the overall performance of a process tool, in particular when a dynamic situation occurs at one or more process tools, for instances caused by the presence of different lot sizes. As discussed above, the process situation in a cluster tool may typically represent per se a dynamic situation, the degree of which may even be "amplified" in combination with an increased degree of variation in lot size. Under these conditions, the transport rules implemented in conventional cluster tools may result in a non-optimal tool performance.

The present disclosure is directed to various methods and systems that may solve, or at least reduce, some or all of the aforementioned problems.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, disclosed herein is a technique for enhancing the performance of process tools, such as cluster tools, by dynamically adapting a control mechanism used in an automated substrate handling system, which may provide substrates to and from a plurality of process modules on the basis of specified control criteria. As previously explained, an automatic substrate handling system may encounter a sequence of dynamic events when processing a plurality of substrates delivered to a plurality of load ports, since the automatic substrate handling system may be confronted with a plurality of competitive tasks, which are conventionally served in accordance with a predefined static transport sequencing rule. Typically, a respective rule may be based on specific criteria, such as tool throughput and the like, and may not be changed during operation of the respective process tool. Since the overall performance of the process tool, or the corresponding portion of a respective manufacturing environment or corresponding manufacturing goals, may depend on other influences, such as lot size of substrate carriers, a shift in priority for processing specific substrate lots and the like, a control technique on the basis of a fixed transport sequencing rule may result in reduced tool performance or in significantly reduced flexibility in specific process situations in controlling the process flow of the corresponding manufacturing environment. By providing the potential for dynamically modifying the respective control mechanism for coordinating competitive transport tasks of the automatic substrate handling system, an appropriate shift in tool behavior and thus performance may be initiated in response to a specific process situation.

According to one illustrative embodiment disclosed herein, a cluster tool comprises two or more process modules and a plurality of load ports configured to receive and discharge transport carriers containing substrates. Moreover, the cluster tool comprises a substrate handling system configured to provide substrates from the plurality of load ports to the two or more process modules on the basis of a plurality of transport sequencing rules. Finally, the cluster tool comprises a transport estimation unit operatively connected to the substrate handling system and configured to dynamically select one of the plurality of transport sequencing rules.

According to another illustrative embodiment, a transport control system comprises a controller operatively connected to a substrate handling system of a process tool comprising a plurality of process modules that are served by the substrate handling system. Furthermore, the system comprises a transport situation estimation unit operatively connected to the controller and the process tool, wherein the transport situation estimation unit is configured to estimate a transport situation with respect to substrates to be processed by the process tool on the basis of process information and to instruct the controller to control a transport sequencing of the substrate handling system on the basis of the estimated transport situation.

According to yet another illustrative embodiment, a method comprises receiving process information from a process tool used in a manufacturing process line, wherein the process tool comprises a plurality of process modules and a plurality of load ports for receiving and discharging substrate carriers. The method further comprises dynamically modifying, on the basis of the process information, a control mechanism for coordinating transport activities of a substrate handling system providing substrates to and from the plurality of process modules.

BRIEF DESCRIPTION OF THE DRAWINGS

The disclosure may be understood by reference to the following description taken in conjunction with the accompanying drawings, in which like reference numerals identify like elements, and in which:

FIGS. 1e-1h schematically illustrate the time progression of the tool behavior when operated on the basis of a fixed sequencing rule and on the basis of a dynamic change of the respective control mechanism.

Figure 1A:
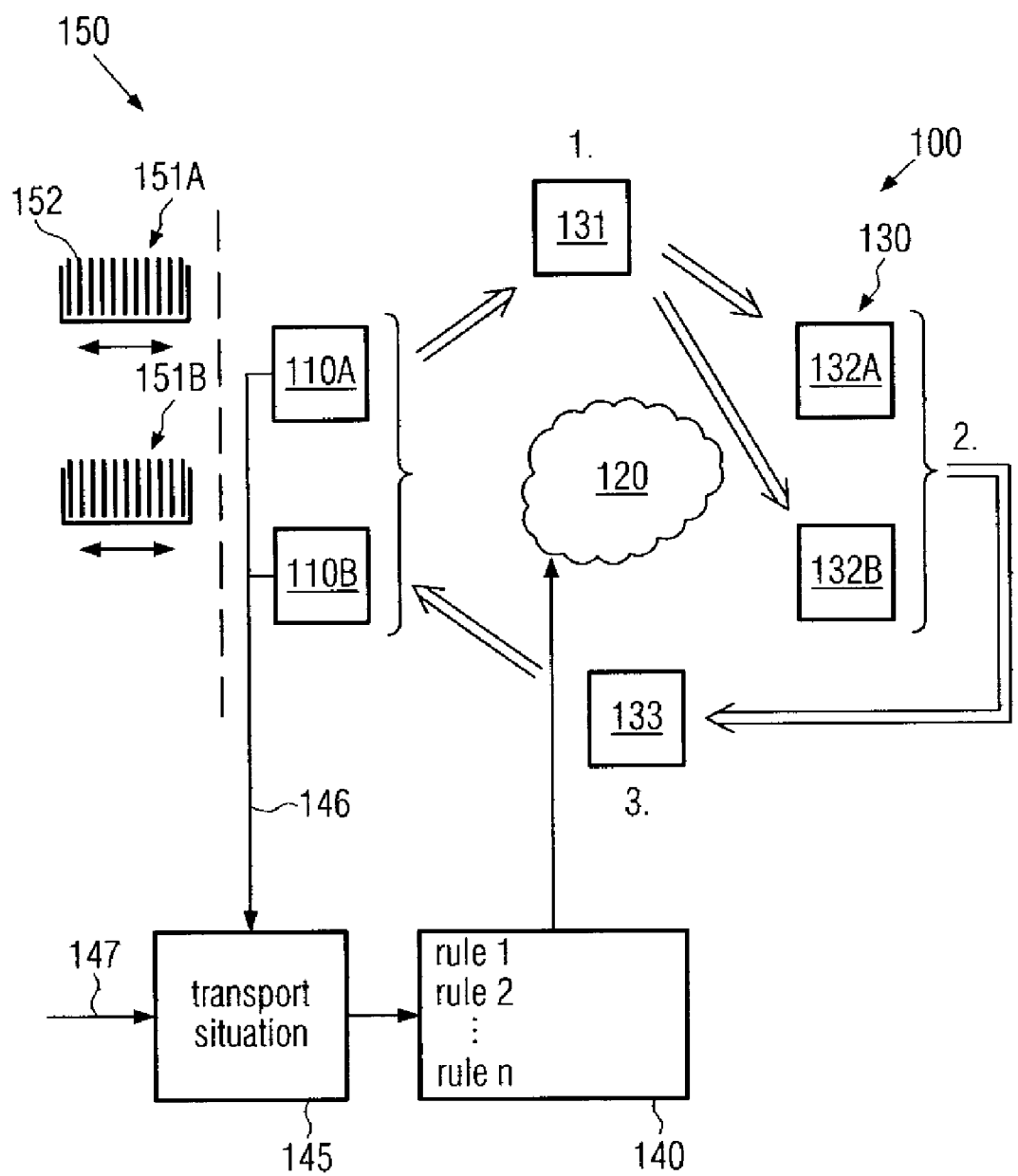
FIG. 1a schematically illustrates a cluster tool in a manufacturing environment, wherein the cluster tool comprises the feature of enabling a dynamic adaptation of a control mechanism for an automatic substrate handling system.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure relates to the coordination of competitive transport tasks of an automatic substrate handling system of a process tool comprising a plurality of process modules that are served by the automatic substrate handling system. As previously explained, there is an ongoing tendency for increasing the complexity of process tools used for the fabrication of microstructural devices, such as integrated circuits, in that a plurality of process modules are incorporated into a single mainframe, thereby providing the potential for performing a plurality of different process steps within a small footprint of the semiconductor facility, while at the same time reducing transport distances between the various process steps and/or increasing the capacity of process tools by providing a plurality of parallel process modules. Typically, a mixture of sequential and parallel operation is provided in cluster tools, which may therefore define a plurality of possible process paths through the tool, wherein different stages of the various process paths may differ in capacity, thereby defining a "bottleneck" stage, which may be considered as that process module or modules performing a certain process in the sequence of different process steps performed within the cluster tool, having the minimum process capacity. Consequently, as long as substrates are present in the cluster tool, a typically preferred strategy in operating the cluster tool may be designed such that the bottleneck module(s) may be kept busy all the time, thereby maximizing tool throughput, at least for the time when substrates are present in the respective load ports of the cluster tool. Thus, control mechanisms are typically implemented into the automatic substrate handling system of the cluster tool so as to coordinate the substrate transport such that keeping the bottleneck process module(s) busy may be achieved.

As previously explained, the delivery of substrate carriers to and from the respective process tools may typically be performed by an automatic material handling system (AMHS), wherein a certain time for discharging the respective carrier containing the substrates processed by the tool and receiving the carrier containing the substrate to be processed may be substantially independent from the actual number of substrates contained in the various carriers, so that, for very different lot sizes to be processed by the respective tool, a significant variation in tool performance may be observed, since a significant amount of carrier exchange time may have to be accommodated by significantly different process times for the various substrate lots. Consequently, a static transport sequencing rule for coordinating the substrate transfer within the cluster tool, which significantly contributes to the overall performance of the tool, may in conventional techniques not allow flexibility to respond to changes in the process situation, for instance with respect to the presence of substrate lots of very different sizes in the manufacturing environment.

According to the present disclosure, a dynamic adaptation of the respective control mechanism of a tool internal automatic substrate handling system may be accomplished on the basis of appropriate process information, from which a current transport situation or state may be extracted and may be used for selecting an appropriate criterion for controlling the tool internal automatic substrate handling system. The specifics for performing a respective dynamic adaptation may in turn also be defined on the basis of specified criteria, such as optimum tool performance, dynamically changing conditions of the manufacturing environment and the like. In other cases, a dynamic adaptation of the control mechanism may be based on reducing the total cycle time of specific substrates and the like.

It should be appreciated that the present invention may be advantageously applied to process tools, such as cluster tools, used for the fabrication of semiconductor devices, wherein the term "semiconductor device" is to be understood as a generic term for a device formed on the basis of micromechanical or microelectronic manufacturing techniques. However, the general principles of the present invention may also be applied to process tools of other industrial fields, in which products are stepped through complex metrology or production tools in a highly automated fashion. Consequently, unless otherwise specified in the specification and the appended claims, the present invention should not be considered as being restricted to process tools for fabricating semiconductor devices.

FIG. 1a schematically illustrates a process tool 100, which may be part of a manufacturing process line of a manufacturing environment 150, which, in one illustrative embodiment, may represent a manufacturing environment for the fabrication of semiconductor devices. The process tool 100 may comprise a plurality of load ports 110A, 110B which are configured to receive and/or discharge substrate carriers 151A, 151B containing a number of substrates 152, wherein, as previously explained, the number of substrates 152 contained in the various substrate carriers 151A, 151B may vary. For instance, a typical lot size of the carriers 151A, 151B in a semiconductor manufacturing environment may be 25 wafers per carrier, wherein the actual lot size may vary from one, for instance for a "small" pilot lot, to any other number, depending on the process requirements. For example, the processing of test lots, lot sizes on demand, and the processing of a large number of different product types and the like may result in very different lot sizes. As previously explained, the substrate carriers 151A, 151B may be conveyed within the environment 150 on the basis of an automated material handling system and/or by any other means, such as operators and the like. The plurality of load ports 110A, 110B may therefore be considered as an interface, indicated by the dashed line, so as to obtain the carriers 151A, 151B from the remaining portion of the environment 150 and to discharge substrates processed by the tool 100 into the rest of the environment 150, wherein this process may commonly be referred to as carrier exchange. It should be appreciated that the load ports 110A, 110B may have any appropriate configuration for receiving any specific type of carriers 151A, 151B, such as FOUP (front opening unified pods) and the like, wherein the load ports 110A, 110B, or at least some of the ports, may provide a controlled ambient so as to reduce contamination of the substrate 152 during carrier exchange and during transporting the substrate 152 within the tool 100.

The process tool 100 may further comprise a plurality of process modules or process chambers 130, wherein, in some illustrative embodiments, the process chambers 130 may represent equivalent process modules designed to perform substantially the same processes, thereby providing a high degree of parallelism for the respective process. In other cases, the process modules 130 may represent a sequence of process modules performing different process steps. In still other illustrative embodiments, the process modules 130 may represent a mixture of sequential and parallel process modules. In the embodiment shown, one or more process modules 131 may be provided which may represent step 1 of a process sequence performed by the tool 100. A plurality of equivalent process modules 132A, 132B may, for instance, represent a second (2) step of the process sequence, while a process module 133 may represent the final step of the process sequence, indicated as step 3, and may be represented by a single process chamber. For instance, the process tool 100 may represent a deposition tool for a process sequence for depositing different layers, possibly including any cleaning steps, or the tool 100 may represent a complex chemical mechanical polishing (CMP) tool for a process sequence requiring the polishing of different materials in subsequent process steps, possibly including rinsing and drying steps, and the like. It should be appreciated, however, that the arrangement of the tool 100 as shown in FIG. 1a is of illustrative nature only and the process sequence including steps 1-3, wherein step 2 may provide for parallel processing, may represent any appropriate process sequence without intending to restrict the present invention to the sequence illustrated.

The process tool 100 may further comprise an automatic substrate handling system 120, which may be provided, in some illustrative embodiments, as a robot system configured to access the load ports 110A, 110B and the process modules 130 in order to appropriately deliver substrates 152 to be processed within the tool 100 to the respective process modules 130. It should be appreciated that the automatic substrate handling system 120 may actually represent a complex mechanical and electronic system, wherein the overall configuration depends on the complexity of the tool 100. Typically, due to the high complexity of the substrate handling system 120 and due to the fact that typically processes in the various process modules 130 may have significantly longer operational times compared to a single transport activity of the system 120, the system 120 may perform a single transport task or activity at a time. In other illustrative embodiments, the system 120 may perform more than one transport activity at a time, while typically, nevertheless, for a typical process situation, the number of transport requests launched by the various process modules 130 may exceed the number of transport activities that may be simultaneously performed by the system 120. Consequently, the system 120 may comprise respective controller units configured to operate the system 120, that is, coordinate the transport activities of the system 120, on the basis of a predefined control strategy. That is, the system 120 is configured to receive respective requests for transport activities from the process modules 130 and may serve the respective requests on the basis of a specific algorithm so as to obtain a desired overall behavior of the tool 100.

Figure 1B:
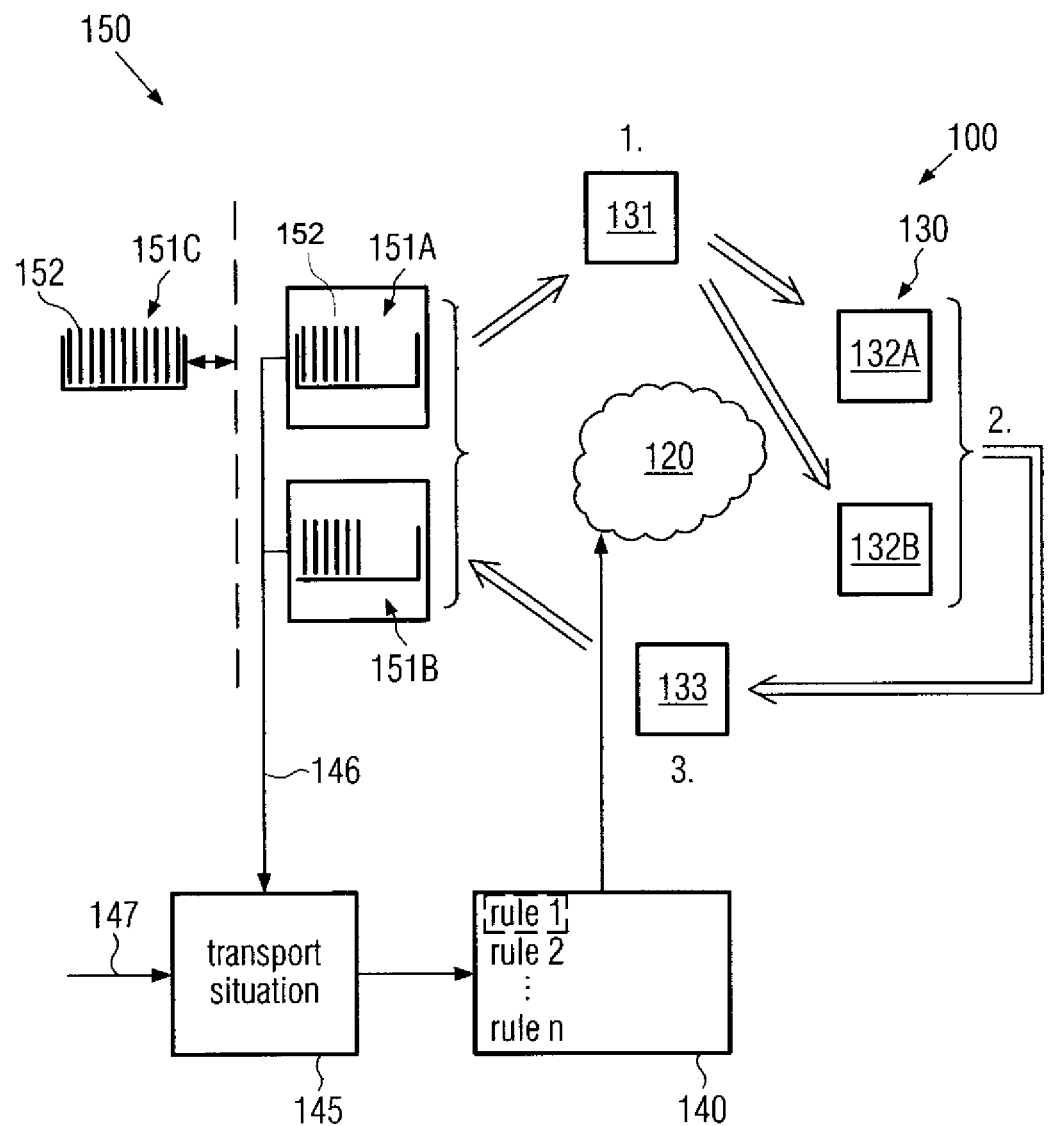
FIGS. 1b-1c schematically illustrate the cluster tool as shown in FIG. 1a when operated on the basis of a static transport sequencing rule.

In one illustrative embodiment, the substrate handling system 120 is operatively connected to a controller 140 having implemented therein a mechanism for causing the system 120 to perform the transport activities according to specified criteria, wherein the controller 140 is configured to dynamically change the corresponding control mechanism. In one illustrative embodiment, the controller 140 may have implemented therein two or more transport sequencing rules, which may provide or establish a control strategy in accordance with respective well-defined criteria. For instance, rule 1, as indicated in FIG. 1b, may correspond to an operational behavior of the respective control mechanism, which may result in an optimized throughput of the tool 100, as long as substrates 152 are available at one of the load ports 110A, 110B. In another rule implemented in the controller 140, a respective criterion may be the priority of the respective process modules 130, i.e., upon occurrence of simultaneous transport requests, the process module having the higher priority may be served first. In still other rules of the controller 140, other tool or process specific criteria may be defined in order to determine the operational behavior of the system 120. Thus, contrary to conventional cluster tools, the controller 140 may dynamically select an appropriate rule or may modify the respective controller mechanism of the system 120 in response to the process situation in the environment 150.

For this purpose, in one illustrative embodiment, the controller 140 may be operatively connected to a transport situation estimator 145, which, in turn, may be operatively connected to the load ports 110A, 110B for receiving process information 146 therefrom, and, in other illustrative embodiments, additionally or alternatively, to other sources for process information 147 related to the environment 150 and the process tool 100. The transport situation estimator 145 may be configured to estimate, on the basis of the process information supplied thereto, a corresponding transport situation, i.e., a plurality of parameters related to the environment 150 and the process tool 100 with respect to substrate delivery from and to the tool 100. For example, respective parameters for characterizing the transport situation may include the presence of substrate carriers 151A, 151B in the respective load ports 110A, 110B, an expected time of arrival of further substrate carriers at one or more of the load ports 110A, 110B, the actual number of substrates within each of the respective substrate carriers 151A, 151B, the process status of the substrates 152 and the like. Based on the estimated transport situation and on specific process criteria, the estimator 145 may be configured to instruct the controller 140 to operate on the basis of an appropriately modified control mechanism for the system 120, for instance by selecting one of the rules 1 to n implemented in the controller 140 when a plurality of predefined rules are provided in advance.

For example, the estimator 145 may, in some illustrative embodiments, be configured to determine the respective transport situation and to assess the estimated situation on the basis of predefined criteria, such as overall performance enhancement of the tool 100 and the like, while, in other embodiments, a plurality of criteria, for instance in a hierarchic order, may be used so as to dynamically modify the operational behavior of the controller 140 on the basis of the estimated transport situation. For instance, if the general criterion for assessing the estimated transport situation is maximum tool performance, the transport situation may be estimated by the estimator 145 for a first time interval and a corresponding operational behavior of the system 120 may be selected so as to obtain maximum throughput of the tool 100 during the time interval considered. Upon estimating the transport situation during a second subsequent time interval, which may result in a different transport situation, for instance the presence of a carrier 151A, 151B containing a significantly reduced number of substrates, the controller 140 may be instructed to change its control strategy so as to avoid undue idle time of the tool 100 during respective carrier exchange intervals, which may be required more frequently due to the presence of carriers of reduced lot size. In other cases, the transport situation may indicate, for instance due to a delayed delivery of further substrate carriers to the load ports 110A, 110B, an inevitable idle time of the tool 100 in a later stage, thereby enabling the usage of a different control strategy in the present process stage of the tool 100, for instance in order to accelerate the processing of a specified lot, while delaying the processing of another lot.

During operation of the process tool 100 within the environment 150, the estimator 145 may receive appropriate process information 146 from the plurality of load ports 110A, 110B which may, for instance, include an indication whether or not a respective carrier is present in the respective load port, the number of substrates, i.e., the lot size within the respective carrier, and the like. Furthermore, in other illustrative embodiments, the other process information 147 may be supplied by other sources, such as a supervising control system, for example in the form of a manufacturing execution system (MES) and the like, which may include additional information with respect to the carriers and thus the substrates to be processed in the tool 100. For instance, a substrate identifier, the priority of processing of respective substrates and the like may be delivered by means of the additional process information 147.

It should be appreciated that, in some embodiments, the estimator 145 may also receive or have the capability of determining tool specific characteristics with respect to the substrate to be processed, such as typical cycle times for the process sequence under consideration and the like. Based on the process information 146 and possibly 147, the estimator 145 determines the respective transport situation, i.e., a representative metric, in order to determine therefrom a selection criterion for an operation mode of the controller 140. For example, the estimator 145 may determine on the basis of the information 146 the number of substrates contained in carriers within the plurality of load ports 110A, 110B, which are not to be exchanged next, since substrates of a specific carrier are currently processed and are to be exchanged next with the next carrier arriving at the tool 100. For instance, it may be assumed that a carrier with standard lot size, for instance 25 substrates, may be present on the load port 110A, wherein the respective substrates 152 are currently processed. Moreover, a respective carrier may be present in the load port 110B or may be shortly received therein, for instance also having a standard lot size, so that the carrier in the load port 110A may be the next carrier to be exchanged, while the substrates in the carrier of the load port 110B may define a respective time window for discharging the carrier on the load port 110A and receiving a new carrier therein. Consequently, the estimator 145 may estimate, under such conditions, the respective transport situation on the basis of carriers and substrates currently present in the load ports 110A, 110B, for instance by determining the respective window of opportunity for exchanging the carrier that is next to be exchanged. Thus, in this situation, the estimator 145 may determine that for a first time interval, for instance for the processing of substrates in the carrier located in the load port 110A, a specific control mechanism or rule of the controller 140 may be appropriate for controlling the operation of the automatic substrate handling system 120.

Since the availability of further substrates from the carrier positioned on the load port 110B is ensured, substantially continuous operation of the tool 100 is possible and substantially the same transport situation may be assumed for a second time interval, substantially corresponding to the processing of the substrates on the carrier of load port 110B. Hence, in this case, a change of the operational behavior of the system 120 may not be necessary. Consequently, the substrate handling system 120 may be instructed by the controller 120 to perform respective transport activities so as to unload substrates from the carrier in the load port 110A and to supply substrates to the process module 131, representing the first step of the process sequence performed in the tool 100 such that minimum idle time or non-productive time of the module 131 may be achieved when this process module 131 may represent the bottleneck of the entire process sequence 1, 2 and 3 of the tool 100. Minimizing the non-productive time of the module 131 may represent one of several criteria for controlling the system 120 which, however, provides maximum tool throughput. It should be appreciated, however, that other criteria may be implemented in the respective control mechanism or control rules.

Since a plurality of substrates may be simultaneously processed by the tool 100 in the various process modules 130, competitive transport tasks to be met by the system 120 may result in a different operational behavior of the tool 100, depending on the respective control strategy. In the aforementioned example of a minimum idle time of the bottleneck module, for instance the module 131, the transport activities of other substrates in the remaining process modules may be correspondingly delayed until the bottleneck module 131 is served by the system 120 and thereafter the remaining substrates may be stepped through the process modules 132A, 132B, 133, which may also be performed on the basis of a respective strategy. For instance, the process module having the next higher process capacity compared to the bottleneck module may be served next. After all of the substrates of the carrier in the load port 110A may be entered into the process sequence of the tool 100, the system 120 may then receive substrates from the load port 110B substantially without an additional idle time.

FIG. 1*b* schematically illustrates the process tool 100 during a specific process situation in which a first carrier 151A, for instance having a standard lot size such as 25 substrates, is positioned in the load port 110A and a plurality of substrates 152 thereof are currently processed in the process modules 130. Moreover, a second carrier 151B may be positioned in the load port 10B and may contain a lot having a significantly reduced size, for instance the carrier 151B may include 5 substrates. Consequently, based on the respective process information 146, the estimator 145 may determine the respective process situation and may select a desired operational behavior for the handling system 120, which may be indicated as rule 1 in the controller 140. As previously explained, a plurality of different operational modes or behaviors may be available for the controller 140 so as to enable a dynamic adaptation or modification of the transport sequencing when cycling substrates through the process modules 130. In this representative example, it may be assumed that rule 1 corresponds to a behavior of "optimum throughput," i.e., supplying substrates to the bottleneck module, for instance the module 131, in order to minimize idle time thereof. In this process situation, the estimator 145 may further determine on the basis of available information that, depending on the timely availability of a further carrier 151C at the load port 110A, the window of opportunity for exchanging the carrier 151A, which is determined by the substrates in the carrier 151B, may not suffice to allow a substantially continuous operation of the tool 100, since the typical carrier exchange time may be longer than the time interval provided by the small lot size of the substrates in the carrier 151B. Hence, during the subsequent processing of the substrates in the carrier 151B and during the exchange of the carriers 151A, 151C, an unavoidable idle time of the tool 100 may be created.

Figure 1C:
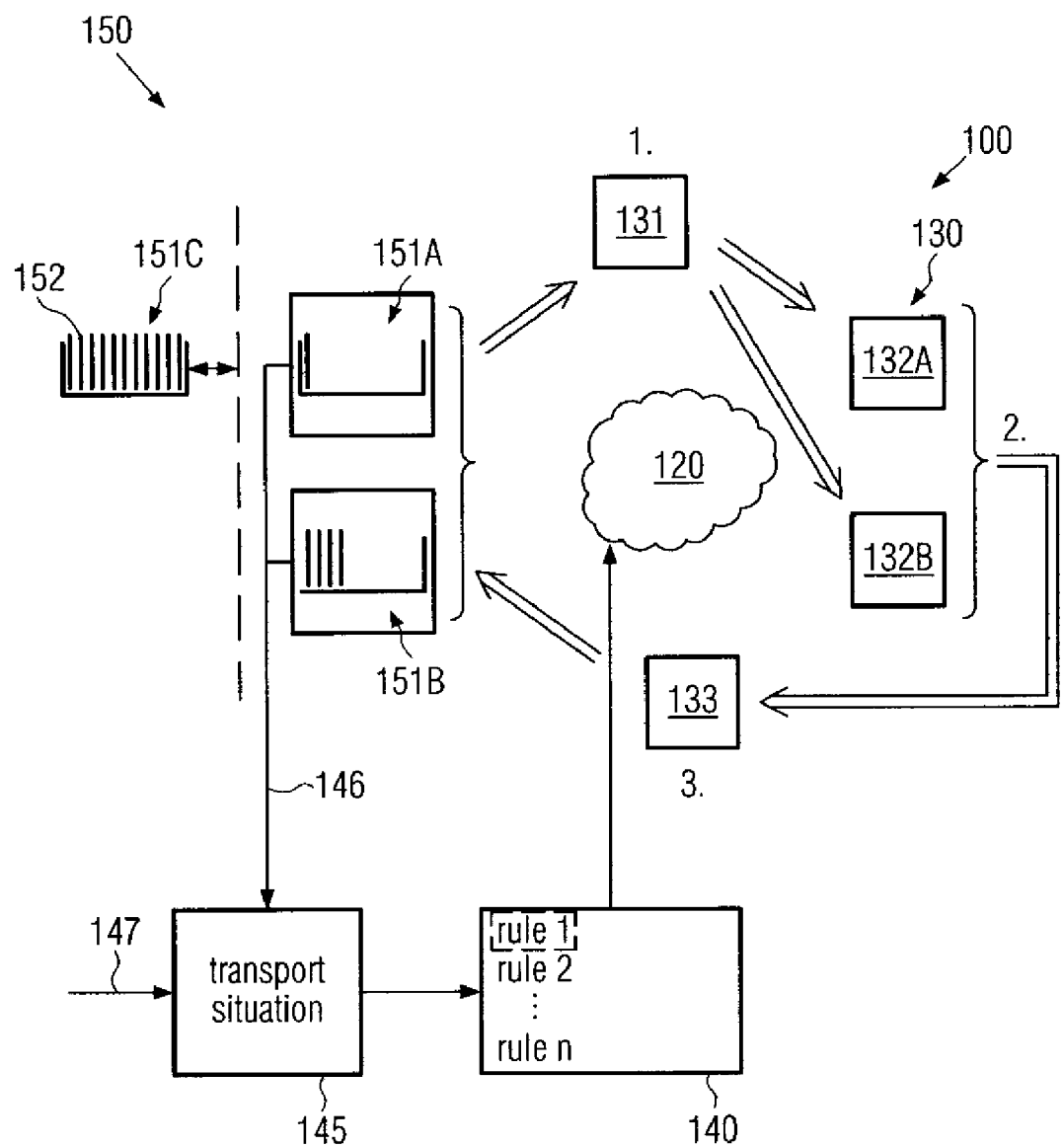

FIG. 1c schematically illustrates the process tool 100 in a further advanced processing state, when the last substrate of the carrier 151A is entered into the process module 131 and thereafter substrates of the carrier 151B are entered in the module 131, still on the basis of rule 1. It should be appreciated that a corresponding operational behavior of the tool 100 with respect to the transport sequencing rules as indicated in FIG. 1c may substantially correspond to a "conventional" tool operation mode, wherein the corresponding transport sequencing rules are static.

Figure 1D:
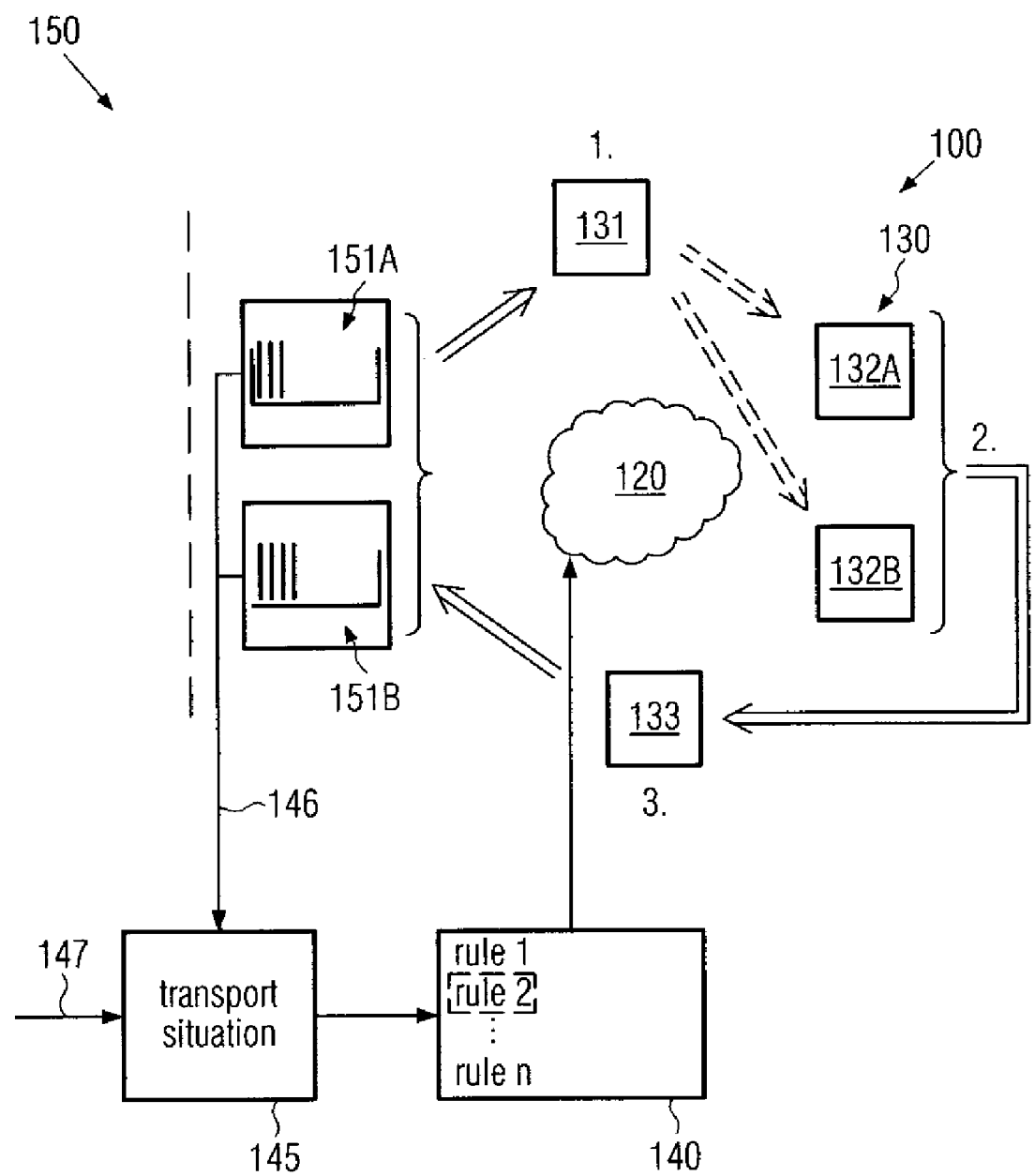
FIG. 1d schematically illustrates the cluster tool of FIG. 1a when operated on the basis of a dynamic adaptation of the control mechanism.

FIG. 1d schematically illustrates the process tool 100 in a similar situation as shown in FIG. 1b, wherein, however, the capability of dynamic adaptation of the transport sequencing behavior of the system 120 is enabled. That is, as previously described, the estimator 145 may determine the respective transport situation and may select, based on specific criteria, an appropriate operational behavior of the controller 140, for instance by instructing the controller 140 to use a specified one of the rules 2-n, such as rule 2. For instance, during a first time interval, the system 120 may be operated on the basis of rule 1, as shown in FIG. 1b, in order to obtain a high tool throughput during this time interval, while, in a second time interval, the estimator 145 may instruct the controller 140 to change the control strategy, for instance by using rule 2 as indicated in FIG. 1d, thereby dynamically adapting the operational mode of the system 120 to the estimated transport situation. For instance, rule 2 may change the control mechanism from an operational behavior determined by "minimizing idle time of the bottleneck module" to "reducing or minimizing the cycle time of the remaining substrates of the carrier 151A." In this case, the processing of the substrates in the carrier 151A may be accomplished in less time compared to the situation as described in FIG. 1c, thereby allowing an earlier exchange of the carrier 151A, resulting in a reduced overall process time of the respective substrates and, if the carrier 151C (FIG. 1b) is already available at the load port 110A, the respective substrates contained therein are available for further processing earlier compared to the situation as described in FIG. 1c. Consequently, the overall performance of the tool 100, when considered over a wider time horizon, may be increased. That is, when the last substrate of the carrier 151A is entered into the module 131, the estimator 145 may instruct the controller 140 to use rule 2, at least as long as substrates of the carrier 151A are stepped through the process modules 130, which may, however, increase the overall cycle time for substrates of the carrier 151B, which on the other hand provides an increased window of opportunity for exchanging the carrier 151A.

FIGS. 1e and 1f schematically illustrate the respective process situations as shown in FIGS. 1b, 1c and 1d in a schematic time diagram. FIG. 1e schematically illustrates the processing according to FIGS. 1b and 1c, that is, without a dynamic adaptation of the operational mode of the system 120. Hence, the substrates of the carrier 151A positioned in the load port 110A are processed, that is, are stepped through the sequence 1, 2 and 3 of the tool 100 in an overall process time indicated as TA. As previously explained, the substrates of the carrier 151A are processed by using rule 1, which may correspond to a specific control strategy for the system 120, thereby resulting in the specific overall process time TA, which additionally may depend on the specifics of the respective processes performed in the process modules 130. As explained above, after entering the last substrate of the carrier 151A, which may correspond to the point in time TA1, substrates of the carrier 151B may be stepped through the modules 130 while using the same rule 1. Consequently, after a specified overall process time TB, the processing of the substrates of the carrier 151B may be completed. After the completion of the processing of the substrates of carrier 151A, the carrier 151A may be exchanged for the carrier 151C, for which typically a specific carrier exchange time indicated as TE is required. Consequently, during a time interval TI, the process tool 100 is idle, since the lot size of the carrier 151B is too small to keep the tool 100 busy, at least the bottleneck module thereof, until the substrates of the next carrier 151C are available for processing.

FIG. 1f schematically illustrates the situation as described with reference to FIG. 1d, i.e., with a dynamic change of the transport sequencing rules. As explained above, the processing of the substrates of carrier 151A may be performed on the basis of rule 1 until TA1, when for instance the last substrate is entered into the module 131. Thereafter, the controller 140 is instructed to use a different control strategy for the system 120 such that the cycle time of the substrates of carrier 151A is reduced. That is, at least in the time interval TA1 to TA2, the substrate handling system 120 may be operated under the condition that substrates of the carrier 151A are "preferred" in order to reduce the overall process time, which is now indicated as TR and which is less compared to the overall process time TA, as indicated in FIG. 1e. This means that from point in time TA1, the system 120 fulfills the corresponding transport tasks by delaying the delivery of substrates of the carrier 151B to the bottleneck module 131 for the benefit of performing transport tasks of substrates belonging to the carrier 151A with higher priority. Consequently, the respective overall process time of the substrates of the carrier 151B, now indicated as TP, is longer compared to the process time TB, which, however, may not negatively influence the overall performance of the tool 100 since the carrier exchange is not completed yet, as indicated in FIG. 1f. However, due to the reduced overall process time TR of the carrier 151A, the carrier 151C is available earlier and consequently processing of the substrates contained therein may be started earlier, thereby increasing performance of the tool 100.

As indicated, the gain in performance corresponds to a time interval T, which may correspond to a single substrate interval or more, depending on the specifics of the corresponding process situation. For instance, for complex cluster tools having the bottleneck process module at the beginning of the process sequence and with the presence of the plurality of highly different lot sizes to be processed in the tool 100, a significant gain in overall performance may be achieved. It should be appreciated that, depending on the process situation, the controller 140 may be instructed to operate on the basis of another control strategy at the time TA2, as indicated in FIG. 1f, as long as it is ensured that the processing of the substrates of the carrier 151B may be completed within the carrier exchange time TE in order to not negatively affect the processing of the next carrier 151C. For instance, at time TA2 or after the completion of the processing of the carrier 151B, the controller 140 may be instructed to return to rule 1 when the further processing of the carrier 151C is desired to be based on a process strategy resulting in maximum tool throughput. Consequently, the estimator 145 may assess a specific transport situation on the basis of predefined criteria, such as maximum tool performance and the like, wherein, in the above-described illustrative embodiment, the estimator 145 may determine the transport situation on the basis of the available information 146 and may recognize the necessity for a dynamic modification of the transport sequencing strategy when a lot size is identified, whose processing is completed within the carrier exchange time TE, since, in this case, the window of opportunity for carrier exchange of the currently processed carrier that is to be exchanged next is increased, which may result, if the next carrier is already available, in an increased overall throughput of the tool 100. In other cases, other criteria may be defined for assessing the respective transport situation by the estimator 145.

Consequently, the corresponding dynamic adaptation of the transport sequencing rules may be performed on the basis of the tool-specific situation only, thereby imparting a high degree of flexibility to the tool 100 with respect to internal control regimes and enhancing its performance. In other illustrative embodiments, the dynamic adaptation may also be performed on the basis of external conditions, which may be conveyed via the process information 147 (FIG. 1a) in order to provide the potential of increasing the time horizon for tool performance adaptation. For instance, if the additional process information 147 may indicate that the carrier 151C may not be available within a specific time horizon, due to delays in other portions of the manufacturing environment 150, the dynamic adaptation may be performed on the basis of other criteria, such as preferring the small lot size in order to reduce the cycle time thereof and the like.

FIGS. 1g and 1h schematically illustrate the situations as described when referring to FIGS. 1e and 1f, respectively, in which the process situation is described with reference to a sequence of events, wherein each event describes the completing of processing of a single substrate.

FIG. 1g thus illustrates an operational mode of the tool 100 while using the same transport sequencing rule, such as rule 1, as previously explained, resulting in a corresponding sequence of completed substrates. For example, each vertical line 153A represents the completion of the process sequence 1, 2 and 3 performed in the process modules 130, wherein, for instance, the point in time TA1 may indicate when the first substrate of the carrier 151B is entered into the module 131 while still further substrates of the carrier 151A are stepped through the other process modules 132 and 133. At time TA, the last substrate of the carrier 151A has been processed and the next "substrate completed" event is an event 153B for a substrate of the carrier 151B. After five events 153B, the respective substrates are also available at the load port 110B, while the carrier 151A may be exchanged for the carrier 151C.

FIG. 1h schematically illustrates the time progression of the events 153A and 153B, when the control strategy is dynamically modified as discussed above. Consequently, the "substrate completed" events 153A of the last five substrates, corresponding to the number of substrates in the carrier 151B, may occur at reduced time intervals due to the modified priority of performing transport tasks for substrates of the carrier 151A relative to substrates of the carrier 151B, as is described above. Similarly, the first "substrate completed" event 153B may occur at a later point in time compared to FIG. 1g, which, however, does not negatively influence the overall performance of the tool 100, since the carrier exchange in the load port 110A is still not completed. However, since the overall process time of the carrier 151A is reduced, due to the more closely spaced events 153A at the end of the process sequence for the carrier 151A, these substrates are available for the processing earlier and, if the carrier 151C is already available at the time of completing the processing of the carrier 151A, the processing of the carrier 151C may start at an earlier time, thereby enhancing the tool performance.

As a result, the present disclosure provides an enhanced technique for the operation of cluster tools, in which transport sequencing rules may be adapted in a dynamic fashion in response to the current transport situation at the cluster tool. For this purpose, the transport situation may be estimated, for instance on the basis of the number of substrates available at the various load ports of the cluster tool, in order to estimate the window of opportunity for carrier exchange for a carrier currently under process that is to be exchanged next. Since this information is continuously available at the tool site, a corresponding adaptation of the transport rules may be obtained in a highly dynamic manner while, in some illustrative embodiments, additional information may also be used in assessing the current transport situation and in selecting an appropriate transport sequencing rule on the basis of the estimated and assessed transport status. In some illustrative embodiments, a corresponding estimator for the transport situation and a respective controller for controlling the actual control mechanism may be implemented in the respective cluster tool in situ, while, in other illustrative embodiments, the respective components or portions thereof may communicate with a cluster tool via appropriate means, such as interfaces and communications lines. For example, the estimator 145 and/or the controller 140 may be implemented in a supervising control system, such as an MES and the like. Consequently, enhanced flexibility in operating cluster tools may be achieved in particular for process situations in which a plurality of lots of different sizes may be present in the respective manufacturing environment, which may typically result in a reduced size of windows of opportunity for carrier exchange. Thus, by dynamically adapting the transport behavior of a cluster tool with respect to the current transport situation, the window of opportunity for carrier exchange may be increased, thereby providing the potential for increasing tool performance. Moreover, upon using an increasing number of complex cluster tools in combination with very different lot sizes, as may be encountered in semiconductor facilities manufacturing a plurality of different product types on demand, a significant overall throughput increase of the respective cluster tools and thus of the manufacturing environment may be achieved.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A cluster tool, comprising:
   a plurality of load ports configured to receive and discharge carriers with substrates;
   a plurality processing modules deployed in the cluster tool such that substrates are processed sequentially by process modules indicated by one of a plurality of process flows through the cluster tool, each process flow corresponding to a different sequence of the processing modules;

a substrate handling system configured to provide substrates from said plurality of load ports to process modules in the sequence indicated by a process flow that is selected on the basis of a plurality of transport sequencing rules; and a transport estimation unit operatively connected to said substrate handling system and configured to dynamically select one of said plurality of transport sequencing rules that is to be used to select the process flow, dynamic selection of the sequencing rule being performed on the basis of a window of opportunity for carrier exchange at one of the load ports.

2. The cluster tool of claim 1, wherein said transport estimation unit is configured to dynamically select said one of said plurality of transport sequencing rules on the basis of a number of carriers present in said plurality of load ports and a number of substrates in said carriers.

3. The cluster tool of claim 1, wherein said transport estimation unit is further configured to detect the window of opportunity for carrier exchange for a carrier to be exchanged next.

4. The cluster tool of claim 3, wherein said transport estimation unit is further configured to select said one of said plurality of transport sequencing rules so as to increase said window of opportunity compared to said detected value thereof.

5. The cluster tool of claim 4, wherein said transport estimation unit is further configured to select another one of said plurality of transport sequence rules after said next carrier has been exchanged.

6. A transport control system, comprising:

a controller operatively connected to a substrate handling system of a process tool comprising a plurality of process modules and at least one load port for receiving and discharging carriers with substrates, the plurality processing modules being deployed in the process tool such that substrates are processed sequentially by process modules indicated by one of a plurality of process flows through the cluster tool, each process flow corresponding to a different sequence of the processing modules, and the plurality of process modules and load ports being served by said substrate handling system configured to direct the substrates from said at least one load port to at least one of the plurality of process modules in the sequence indicated by a process flow that is selected on the basis of at least one selected transport sequencing rule; and a transport situation estimation unit operatively connected to said controller and said process tool, said transport situation estimation unit being configured to estimate a transport situation with respect to substrates to be processed by said process tool on the basis of process information and to instruct said controller to control a transport sequencing of said substrate handling system on the basis of at least one transport sequencing rule selected from a plurality of transport sequencing rules using said estimated transport situation, wherein said estimated transport situation includes a window of opportunity for carrier exchange at one of the load ports, and wherein said at least one transport sequencing rule is to be used to select the process flow.

7. The transport control system of claim 6, wherein said transport situation estimation unit is configured to extract from said process information the window of opportunity of exchange for a carrier to be next exchanged in said process tool.

8. The transport control system of claim 7, wherein said transport situation estimation unit is configured to instruct said controller to control said substrate handling system to increase the number of transport activities for substrates of the carrier to be next exchanged for increasing said window of opportunity thereof.

9. The transport control system of claim 6, wherein said controller is configured to control said substrate handling system on the basis of a first and a second predefined transport sequencing rule for distributing substrates among said plurality of process modules.

10. The transport control system of claim 9, wherein said one of said first and second transport sequencing rules is designed to result in an increase of transport activities for substrates of a carrier next to be exchanged.

11. A method, comprising:

receiving, at a transport situation estimation unit, process information from a process tool used in a manufacturing process line, said process information comprising a window of opportunity for carrier exchange at one of the load ports, said process tool comprising a plurality of process modules and a plurality of load ports for receiving and discharging substrate carriers, said process tool comprising a plurality of processing modules deployed such that substrate carriers are processed sequentially by process modules as indicated by one of a plurality of process flows through the process tool, each process flow corresponding to a different sequence of the processing modules; and dynamically modifying, using the transport situation estimation unit and on the basis of said process information, a control mechanism for coordinating transport activities of a substrate handling system providing substrates to and from said plurality of process modules according to one of the plurality of process flows.

12. The method of claim 11, wherein dynamically modifying said control mechanism comprises identifying a transport situation of said process tool for a first time interval and a second time interval on the basis of said process information, and changing at least one control criterion of said control mechanism when said transport situation in said first time interval differs from said transport situation of said second time interval.

13. The method of claim 12, wherein changing said at least one control criterion comprises using a first predefined transport sequencing rule during said first time interval and using a second predefined transport sequencing rule other than said first transport sequencing rule during said second time interval.

14. The method of claim 11, wherein said process information comprises an indication for the number of substrates contained in substrate carriers that are not to be exchanged in an immediately next carrier exchange operation.

15. The method of claim 14, wherein said control mechanism is dynamically modified so as to enable earlier arrival of a further substrate carrier, relative to an arrival time when maintaining said control mechanism unmodified, at one of said load ports currently holding said substrate carrier to be exchanged.

16. The method of claim 15, wherein a first number of substrates of a first substrate carrier processed prior to modifying said control mechanism is higher than a second number of substrates in a second substrate carrier processed after modifying said control mechanism.

17. The method of claim 16, wherein, after processing said substrates of said second substrate carrier, said modified control mechanism is re-established into a state prior to said modification.

18. The method of claim 16, wherein said control mechanism is modified so as to achieve a reduced process time for said substrates of said first substrate carrier compared to a process time defined by said unmodified control mechanism.

19. The method of claim 18, wherein said unmodified control mechanism is designed for maximum tool throughput.

20. The method of claim 11, wherein said process information is at least partially obtained from a supervising control system controlling said manufacturing process line.

* * * * *